United States Patent
Kim et al.

(10) Patent No.: US 7,514,720 B2
(45) Date of Patent: Apr. 7, 2009

(54) WHITE LIGHT EMITTING DEVICE

(75) Inventors: Min Ho Kim, Kyungki-do (KR);
Masayoshi Koike, Kyungki-do (KR);
Kyeong Ik Min, Seoul (KR); Myong Soo Cho, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 16 days.

(21) Appl. No.: 11/442,961

(22) Filed: May 31, 2006

(65) Prior Publication Data

US 2006/0267026 A1  Nov. 30, 2006

(30) Foreign Application Priority Data

May 31, 2005  (KR) ...................... 10-2005-0046478

(51) Int. Cl.
*H01L 29/201*  (2006.01)
(52) U.S. Cl. .......... 257/90; 257/E33.012; 257/E33.023; 257/E33.031; 257/E33.074; 257/79; 257/88; 257/89; 257/94; 257/96; 257/97
(58) Field of Classification Search .......... 257/E33.012, 257/E33.023, E33.031, 96, 79, 88, 89, 90, 257/94, 97, E33.074
See application file for complete search history.

(56) References Cited

U.S. PATENT DOCUMENTS 6,298,079 B1 * 10/2001 Tanaka et al. ............ 372/46.01

| | | | |
|---|---|---|---|
| 6,576,933 B2 * | 6/2003 | Sugawara et al. | 257/103 |
| 2002/0070681 A1 * | 6/2002 | Shimizu et al. | 315/246 |
| 2005/0189551 A1 * | 9/2005 | Peng et al. | 257/94 |

FOREIGN PATENT DOCUMENTS

| CN | 1619846 A | 5/2005 |
|---|---|---|
| JP | 2002-305327 A | 10/2002 |
| JP | 2004-260111 A | 9/2004 |

OTHER PUBLICATIONS

Chinese Office Action, with English translation, issued in Chinese Patent Application No. CN 200610083100.0, mailed May 30, 2008.

* cited by examiner

*Primary Examiner*—Jerome Jackson, Jr.
*Assistant Examiner*—Jay C Kim
(74) *Attorney, Agent, or Firm*—McDermott Will & Emery LLP (57) ABSTRACT

The invention relates to a monolithic white light emitting device using wafer bonding or metal bonding. In the invention, a conductive submount substrate is provided. A first light emitter is bonded onto the conductive submount substrate by a metal layer. In the first light emitter, a p-type nitride semiconductor layer, a first active layer, an n-type nitride semiconductor layer and a conductive substrate are stacked sequentially from bottom to top. In addition, a second light emitter is formed on a partial area of the conductive substrate. In the second light emitter, a p-type AlGaInP-based semiconductor layer, an active layer and an n-type AlGaInP-based semiconductor layer are stacked sequentially from bottom to top. Further, a p-electrode is formed on an underside of the conductive submount substrate and an n-electrode is formed on a top surface of the n-type AlGaInP-based semiconductor layer.

12 Claims, 11 Drawing Sheets

PRIOR ART

WHITE LIGHT EMITTING DEVICE

CLAIM OF PRIORITY

This application claims the benefit of Korean Patent Application No. 2005-46478 filed on May 31, 2005 in the Korean Intellectual Property Office, the disclosure of which is incorporated herein by reference.

BACKGROUND OF THE INVENTION

1. Field of the Invention

The present invention relates to a white light emitting device, more particularly to a monolithic white light emitting device in which a plurality of active layers are configured into a single device to generate light of at least two different wavelengths, and a manufacturing method thereof.

2. Description of the Related Art

In general, an LED-based white light emitting device is widely utilized as lightening devices or backlights of display devices. In broadly known methods to obtain such a white light emitting device, blue, red and green LEDs manufactured separately are simply combined or a fluorescent substance is employed. But combining multi-colored separate LEDs on a printing circuit board requires a complicated driving circuit therefor, disadvantageously rendering it hardly miniaturizable. Therefore, recently, a method for manufacturing the white light emitting device via the fluorescent substance has been commonly used.

In conventional manufacturing methods using the fluorescent substance, a blue light emitting device or an ultraviolet ray light emitting device is employed. For example, in case of use of the blue light emitting device, blue light is wavelength-converted into white light via a YAG fluorescent substance. That is, blue wavelength generated from the blue LED excites the Yittrium Aluminum Garnet (YAG) fluorescent substance to finally emit white light.

Figure 1:
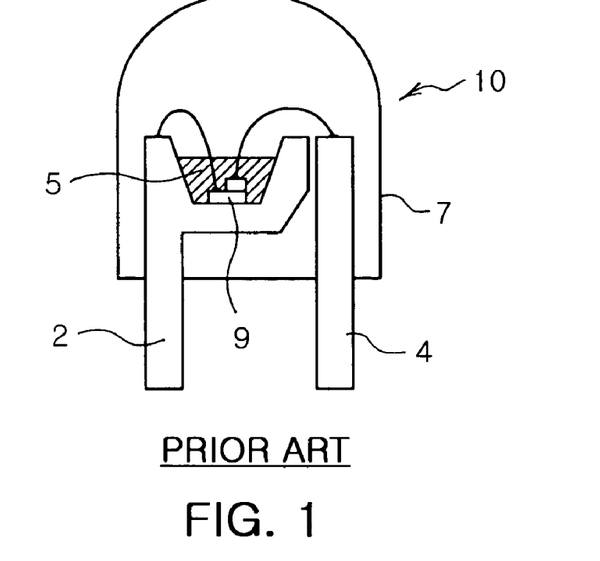
FIG. 1 is a cross-sectional view illustrating a conventional white light emitting device using a fluorescent substance.

FIG. 1 is a cross-sectional view illustrating an overall structure of a conventional white light emitting device 10 using a YAG fluorescent substance. FIG. 1a depicts an InGaN-based blue LED 9 mounted on a cap of a lead frame 2 and the YAG fluorescent substance 5 enveloping the blue LED 9 inside the cap. Also, the blue LED 9 is wired to a cap-structured anode lead frame 2 and a cathode lead flame 4. An upper part of all the lead frames 2 and 4 having the blue LED 10 positioned therein is molded with a transparent material 7.

If current is applied through the lead frames 2 and 4 and blue light is generated from the InGaN-based blue LED 9, some portions of the blue light excite the YAG fluorescent substance 5. At this time, the YAG fluorescent substance is characteristically excited at 460 nm, i.e., a peak wavelength of the InGaN blue LED 10, thereby emitting yellow-green fluorescent light. The yellow-green fluorescent light obtained via the YAG fluorescent substance 5 synthesizes with some other portions of the blue light directly emanated from the blue LED 9 to finally emit the white light.

The white light emitting device shown in FIG. 1 advantageously does not require current control necessary for combining respective RGB LEDs. However, the conventional light emitting device has limitations in that fluorescent powder adversely affects properties of the device, or excellent color feeling is hardly attainable due to decreased light efficiency and color correction index in exciting the fluorescent substance.

SUMMARY OF THE INVENTION

The present invention has been made to solve the foregoing problems of the prior art and it is therefore an object of the present invention to provide a novel white light emitting device in which a plurality of emitters are bonded as a single chip via wafer bonding or metal bonding to generate light of different wavelengths.

According to an aspect of the invention for realizing the object, there is provided a white light emitting device comprising: a conductive submount substrate; a first light emitter bonded onto the submount substrate by a metal layer, the first light emitter including a p-type nitride semiconductor layer, a first active layer, an n-type nitride semiconductor layer and a conductive substrate stacked sequentially from bottom to top; a second light emitter formed on a partial area of the conductive substrate, the second light emitter including a p-type AlGaInP-based semiconductor layer, a second active layer and an n-type AlGaInP-based semiconductor layer stacked sequentially from bottom to top; and a p-electrode formed on an underside of the conductive submount substrate; and an n-electrode formed on a top surface of the n-type AlGaInP-based semiconductor layer.

According to a preferred embodiment of the invention, the conductive substrate of the first light emitter is directly bonded to the p-type semiconductor layer of the second light emitter by wafer bonding, wherein the p- and n-type electrodes are common electrodes of the first and second light emitters.

In the embodiment of the invention, the white light emitting device further comprises a current blocking layer formed on the p-type nitride semiconductor layer of the first light emitter, over a surface area of the p-type nitride semiconductor layer vertically overlapped with a second light emitter forming area. The current blocking layer is doped with n-type impurities. Also, the current blocking layer comprises a silicon oxide film or a silicon nitride film.

According to another embodiment of the invention, the white light emitting device further comprises an insulating layer formed on the partial area of the conductive substrate of the first light emitter, the insulating layer being bonded to the p-type semiconductor layer of the second light emitter by an additional metal layer. In this case, the device further comprises a p-electrode connected to the additional metal layer and an n-electrode connected to the conductive substrate. The first and second light emitters may be driven independently by separate electrodes.

Preferably, according to the invention, the metal layer or the additional metal layer comprises a high reflectivity metal selected from a group consisting of Al, Ag, Rh, Ru, Pt, Pd and alloys thereof. The conductive submount substrate is a p-type silicon substrate.

According to the invention, to ensure sufficient light extraction from the first light emitter to emit white light, preferably, the partial area of the conductive substrate of the first light emitter is smaller than a remaining area of the conductive substrate. Also, preferably, the conductive substrate has a rough pattern formed on an area where the second light emitter is not formed.

In a specific embodiment of the invention, light of two different wavelengths can be combined to obtain white light. In this case, the first active layer is adapted to generate light of a wavelength of about 450 nm to 475 nm and the second active layer is adapted to generate light of a wavelength of about 550 nm to 600 nm.

Alternatively, the first active layer of the first light emitter may be formed of two active layers generating light of different wavelengths so that white light is obtained by combining light of three wavelengths as a whole. At this time, the first active layer includes two active layers for generating light of a wavelength of about 450 nm to 475 nm and light of a wavelength of about 510 nm to 535 nm, respectively, wherein the second active layer is adapted to generate light of a wavelength of about 600 nm to 635 nm.

According to further another embodiment of the invention, the first light emitter is flip-mounted on a submount substrate. The embodiment of the invention may preferably adopt an insulating substrate for a substrate for the first light emitter.

According to the embodiment of the invention, a white light emitting device comprises: a submount substrate having a p-side lead terminal and an n-side lead terminal formed thereon; a first light emitter including a p-type nitride semiconductor layer, a first active layer, an n-type semiconductor layer and an insulating substrate stacked sequentially from bottom to top, the p-type semiconductor layer connected to the p-side lead terminal and the n-type semiconductor layer connected to the n-side lead terminal; a metal layer formed on a partial area of the insulating substrate; a second light emitter formed on the metal layer, bonded to a partial area of the metal layer, the second light emitter including a p-type AlGaInP-based semiconductor layer, a second active layer and an n-type AlGaInP-based semiconductor layer stacked sequentially; and a first p- and n-electrodes connected to the p- and n-type nitride semiconductor layers of the first light emitter, respectively; a second p-electrode connected to another area of the metal layer of the second light emitter; and a second n-electrode connected to the second AlGaInP-based semiconductor layer of the second light emitter.

BRIEF DESCRIPTION OF THE DRAWINGS

The above and other objects, features and other advantages of the present invention will be more clearly understood from the following detailed description taken in conjunction with the accompanying drawings, in which:

FIGS. 3a to 3h are cross-sectional views illustrating in a stepwise fashion a method for manufacturing the white light emitting device of FIG. 2;

DETAILED DESCRIPTION OF THE PREFERRED EMBODIMENT

Preferred embodiments of the present invention will now be described in detail with reference to the accompanying drawings.

Figure 2:
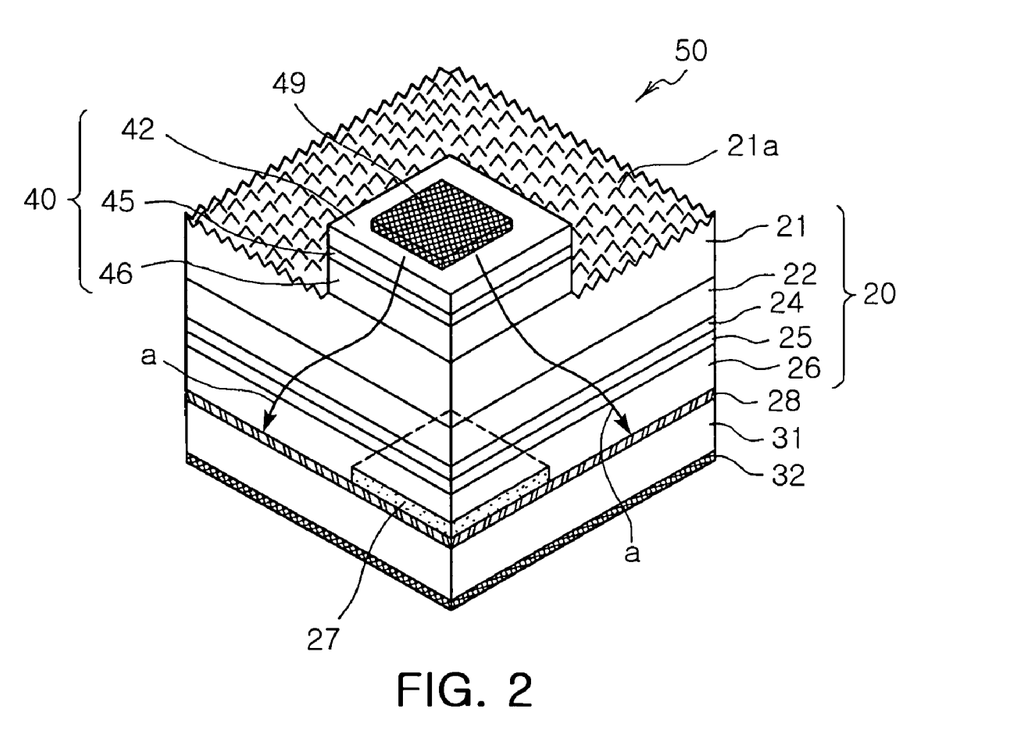
FIG. 2 is a perspective view illustrating a white light emitting device according to one embodiment of the invention.

FIG. 2 is a perspective view illustrating a white light emitting device according to one embodiment of the invention.

The white light emitting device 50 according to the embodiment of the invention includes a conductive submount substrate 31 and first and second light emitters 20 and 40 for emitting light of different wavelengths. The conductive submount substrate 31 may be a p-doped silicon, and a common p-electrode 32 is formed on an underside thereof.

The first light emitter 20 is a nitride stack structure in which a p-type nitride semiconductor layer 26, two nitride active layers 24 and 25, an n-type nitride semiconductor layer 22 and a conductive substrate 21 are disposed sequentially from bottom to top. In the first light emitter 20, the p-type nitride semiconductor layer 26 is bonded onto the submount substrate 31 by a metal layer 28. The metal layer 28 is made of a general bonding metal selected from a group consisting of Au—Sn, Sn, In, Au—Ag and Pb—Sn. Preferably, the metal layer 28 may include a high reflectivity metal. The high reflectivity metal is used in substitute of or in combination with the general bonding metal. The high reflectivity metal is selected from a group consisting of aluminum (Al), silver (Ag), rhodium (Rh), ruthenium (Ru), platinum (Pt), palladium (Pd) and alloys thereof.

The second light emitter 40 is formed on a partial area of the conductive substrate 21. The second light emitter 40 includes a p-type AlGaInP-based semiconductor layer 46, an AlGaInP-based active layer 45 and an n-type AlGaInP-based semiconductor layer 42 stacked sequentially. Preferably, the partial area of the conductive substrate 21 of the second light emitter 40 is smaller than a remaining area of the conductive substrate 21 to ensure a sufficient light extraction area of the first light emitter 20. Additionally, the conductive substrate 21 has a rough pattern formed on an area where the second light emitter 40 is not formed so that light extraction efficiency of the first light emitter 20 is significantly improved.

The white light emitting device 50 can emit white light by combining light of wavelengths of the first light emitter 20 and the second light emitter 40. As shown in FIG. 2, the two active layers 24 and 25 of the first light emitter 20 generate light of wavelengths of about 450 nm to 475 nm and about 510 nm to 535 nm, respectively. Also, the active layer 45 of the second light emitter 40 generates light of wavelength of about 600 nm to 635 nm. Alternatively, the first light emitter 20 may adopt only an active layer that generates light of wavelength of about 450 nm to 475 nm and the second light emitter 40 may adopt an active layer that generates light of wavelength of 550 nm to 600 nm.

The p-electrode 32 formed on the underside of the conductive submount and an n-electrode 49 formed on a top surface of the n-type AlGaInP-based semiconductor layer 42 are used as common electrodes of the first light emitter 20 and the second light emitter 40.

The first light emitter 20 may include a current blocking layer 27 on a certain area of the p-type nitride semiconductor layer 26. In the white light emitting device 50 according to the invention, the current blocking layer serves to improve current spreading effect of the first light emitter 20. The first light emitter 20 commonly uses the n-electrode 49 formed in the second light emitter 40. Also, the second light emitter 40 is formed in a relatively small size on the partial area of the first light emitter 20. This causes a current path to be formed in a restricted area in the first light emitter 20, thus hardly attaining sufficient current spreading effect. Therefore, the current blocking layer 27 is formed on a surface area of the p-type nitride semiconductor layer 26 corresponding to the second light emitter 40 so that current flows as indicated with the reference sign "a" by bypassing the current blocking layer 27 to increase light emitting efficiency. The current blocking layer 27 may be formed by doping n-type impurities at a high concentration on the p-type nitride semiconductor layer 26 or selectively depositing a silicon oxide layer or silicon nitride layer.

FIGS. 3a to 3h are cross-sectional views illustrating in a stepwise fashion a method for manufacturing a white light emitting device 50.

Figure 3A:
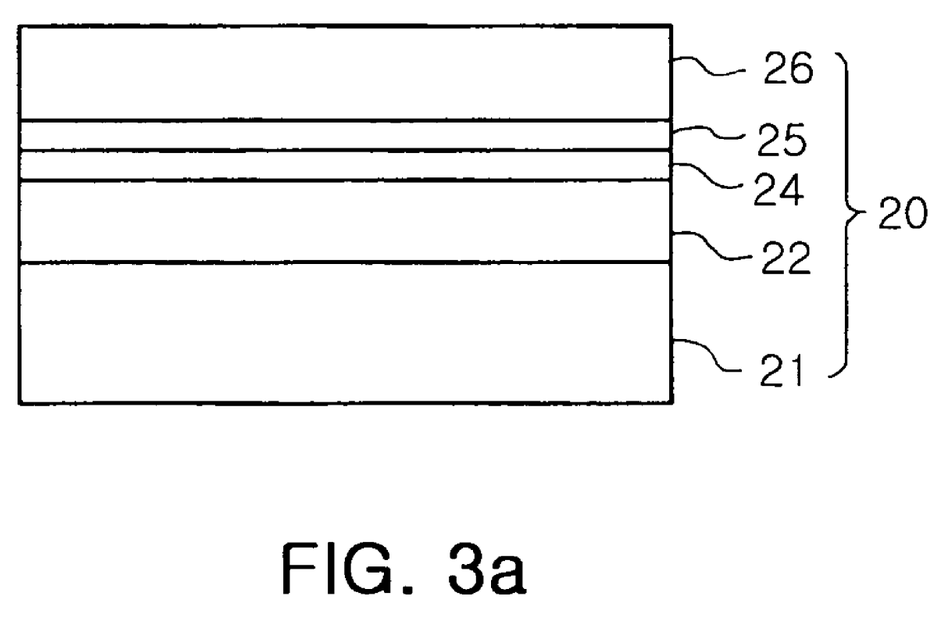

As shown in FIG. 3a, to constitute a first light emitter 20, an n-type nitride semiconductor layer 22, active layers 24 and 25 and a p-type nitride semiconductor layer 26 are stacked sequentially on a conductive substrate 21. The conductive substrate 21 is preferably exemplified by an n-doped GaN substrate.

Figure 3B:
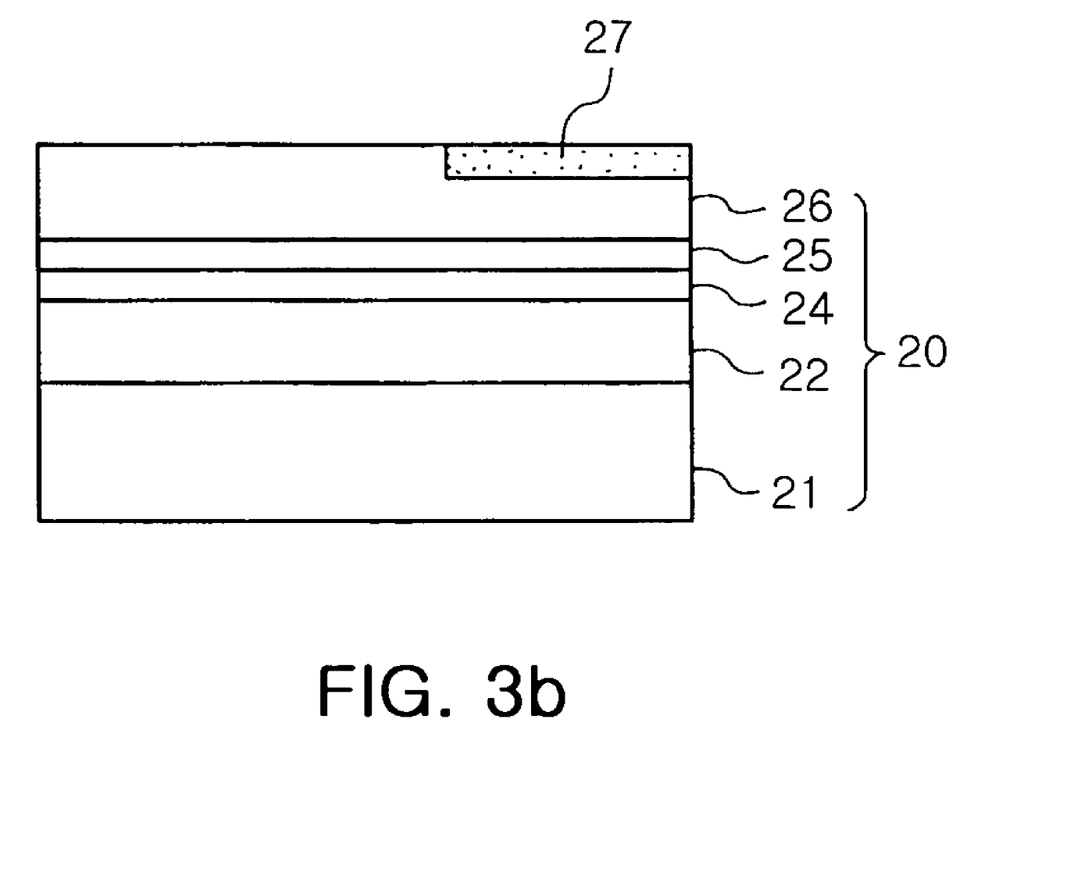

Then, as shown in FIG. 3b, a current blocking layer 27 is formed on a partial area of the p-type nitride semiconductor layer 26. As stated earlier, the current blocking layer 27 is formed on a surface area of the p-type nitride semiconductor layer 26 vertically overlapped with a second light emitter forming area. In the embodiment, to form the current blocking layer 27, a corresponding area is etched to a predetermined depth and then a silicon oxide layer or a silicon nitride layer is selectively deposited. Alternatively, a corresponding area of the p-type nitride semiconductor layer 26 may be doped with n-type impurities at a high concentration.

Figure 3C:
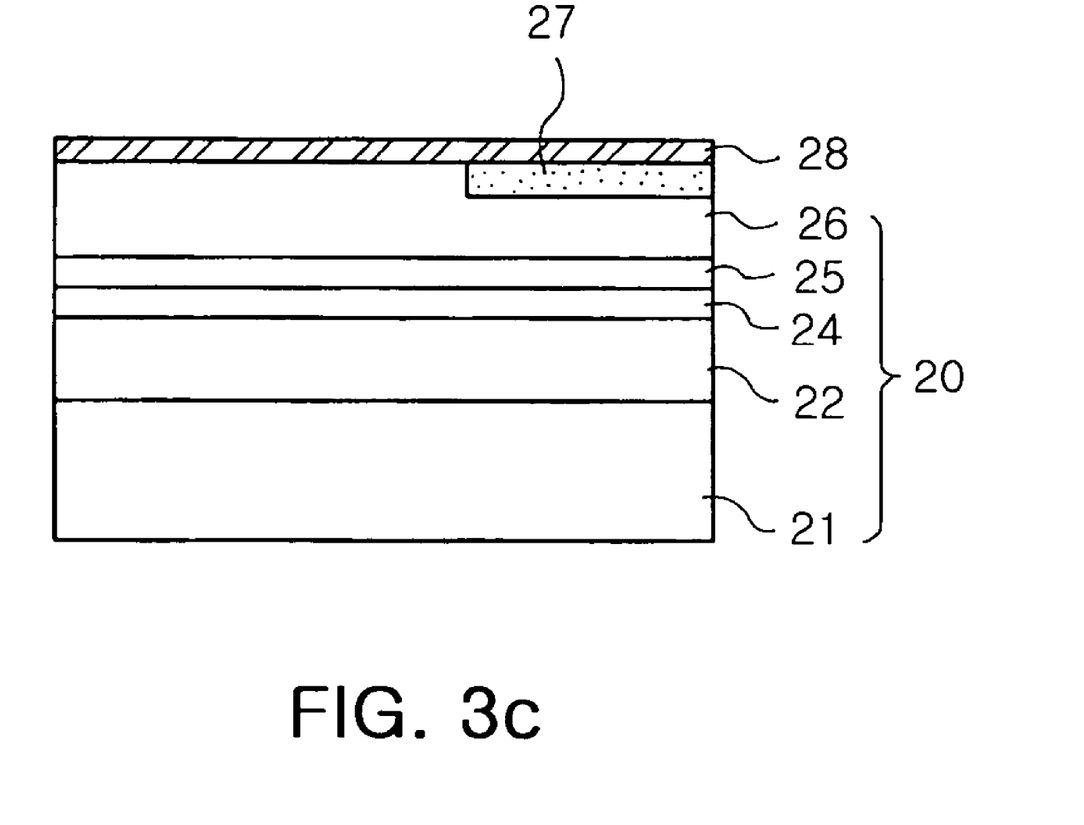

Next, as shown in FIG. 3c, a metal layer 28 is formed on the p-type nitride semiconductor layer 26. The metal layer 28 is made of a general bonding metal selected from a group consisting of se Au—Sn, Sn, In, Au—Ag and Pb—Sn. Preferably, for the metal layer 28, a high reflectivity metal may be used in substitute of or in combination of a general bonding metal. The high reflectivity metal is selected from a group consisting of Al, Ag, Rh, Ru, Pt, Pd and alloys thereof.

Figure 3D:
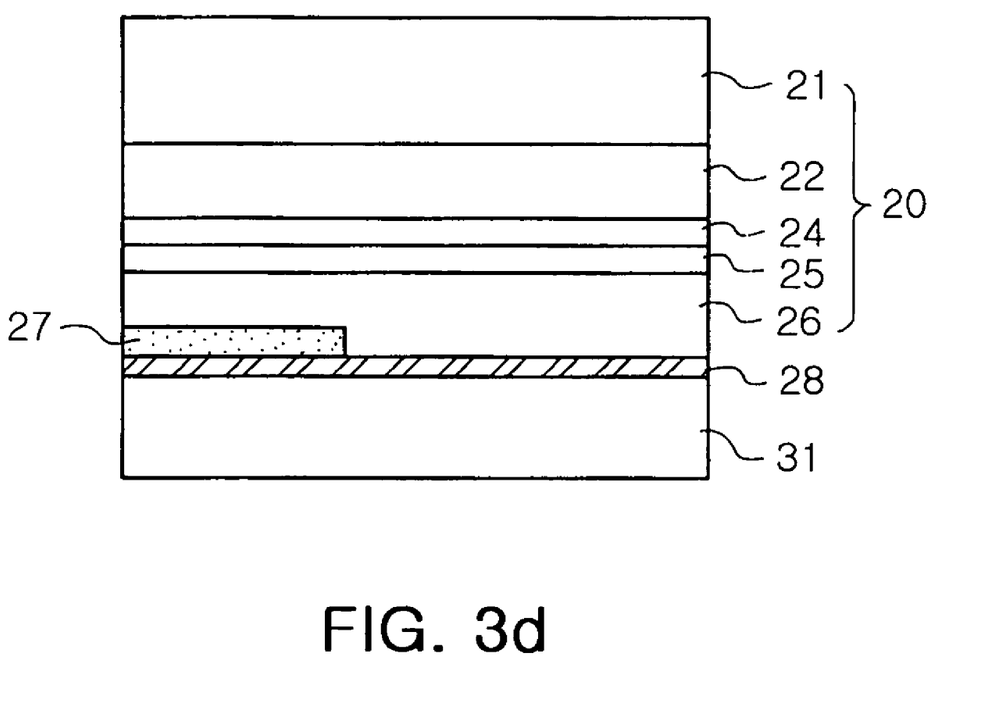

Thereafter, as depicted in FIG. 3d, the first light emitter 20 is bonded onto a conductive submount substrate 31 via the metal layer 28. The conductive submount substrate 31 may be a silicon substrate or a metal substrate. Preferably, the metal bonding is carried out at a temperature of or less than 600° C. to prevent thermal expansion-induced defects from occurring in the first light emitter 20.

Figure 3E:
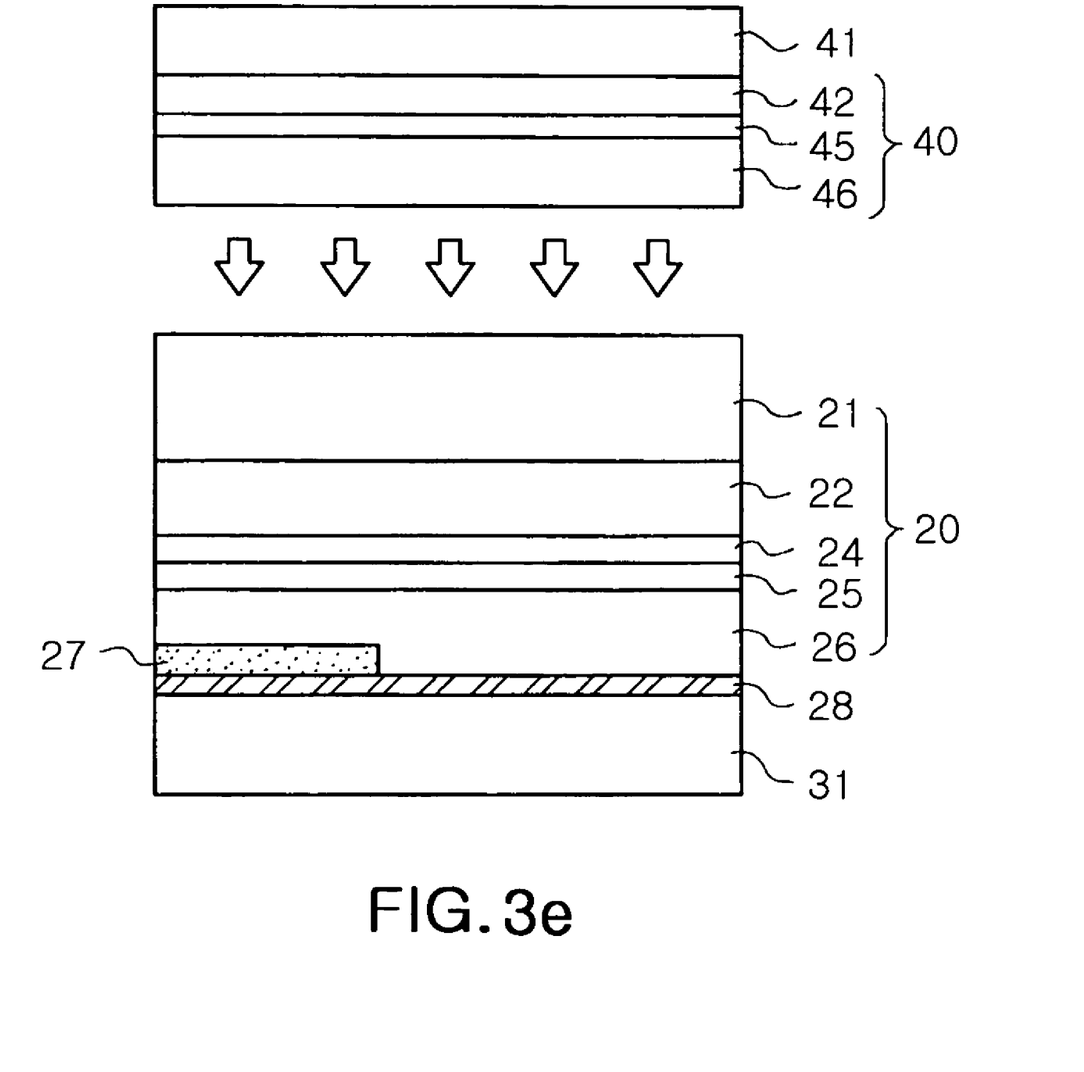

Then, referring to FIG. 3e, a second light emitter 40 made of an AlGaInP-based semiconductor is bonded onto the conductive substrate 21. To obtain the second light emitter 40, an n-type AlGaInP-based semiconductor layer 42, a second active layer 45 and a p-type AlGaInP-based semiconductor layer 46 are deposited sequentially on a GaAs substrate 41. This process may be wafer bonding conducted at a wafer level. The wafer bonding is performed at a temperature lower than a conventional wafer fusion temperature to minimize stress occurrence triggered by thermal expansion. To accomplish this low-temperature wafer bonding, bonding surfaces of each wafer are plasma-treated before bonding to increase a surface energy and then bonded at a low temperature (room temperature to 400° C.).

Figure 3F:
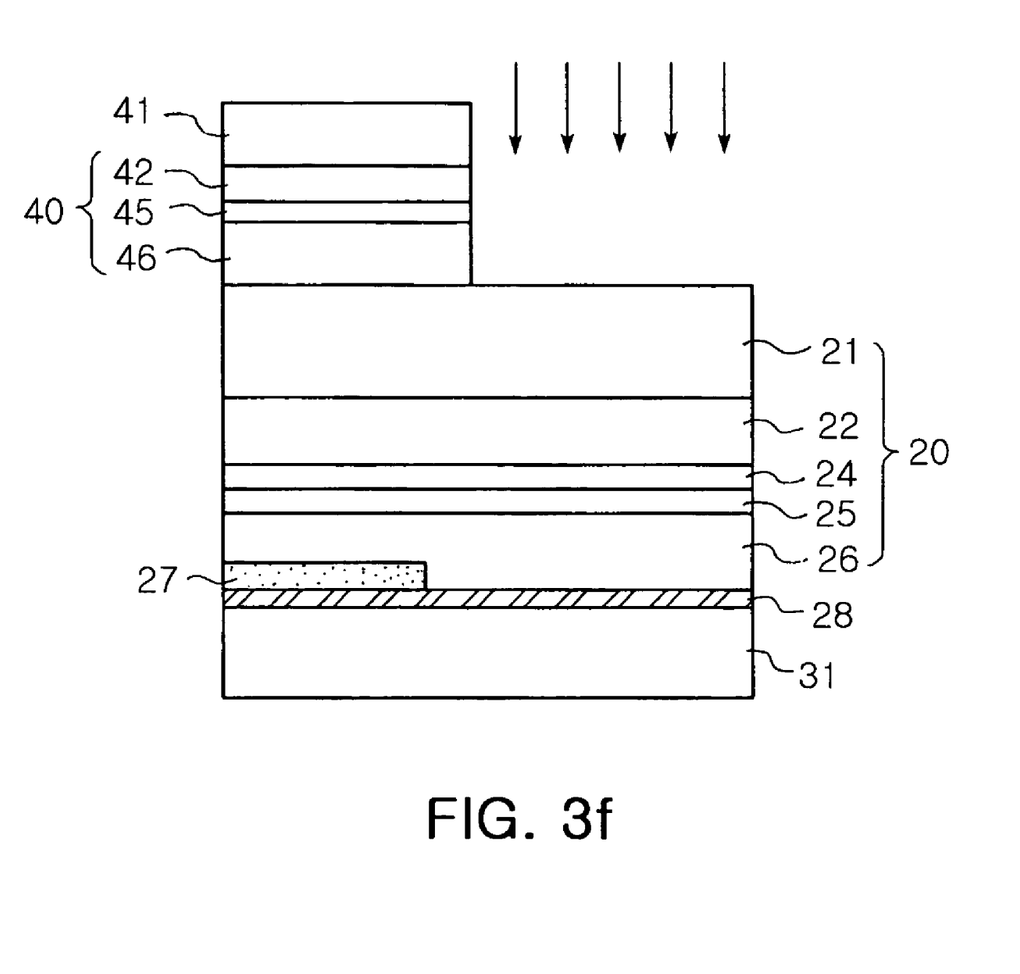

Next, referring to FIG. 3f, the second light emitter 40 is selectively etched so that the second light emitter 40 remains only on a surface area of the conductive substrate 21 corresponding to the current blocking layer 27 disposed in advance. Such process can be easily implemented via wet-etching. Also, an exposed surface area of the conductive substrate 21 and a remaining area of the second light emitter 40 are sized, respectively, in accordance with light emitting efficiency of the nitride-based first light emitter 20 and the AlGaInP-based second light emitter 40, and brightness ratio of light of each wavelength to emit white light. In general, due to excellent efficiency of the AlGaInP-based second light emitter 40 and small ratio of desired red light in white light, preferably, the exposed area of the conductive substrate 21 is larger than the remaining area of the second light emitter 40.

Figure 3G:
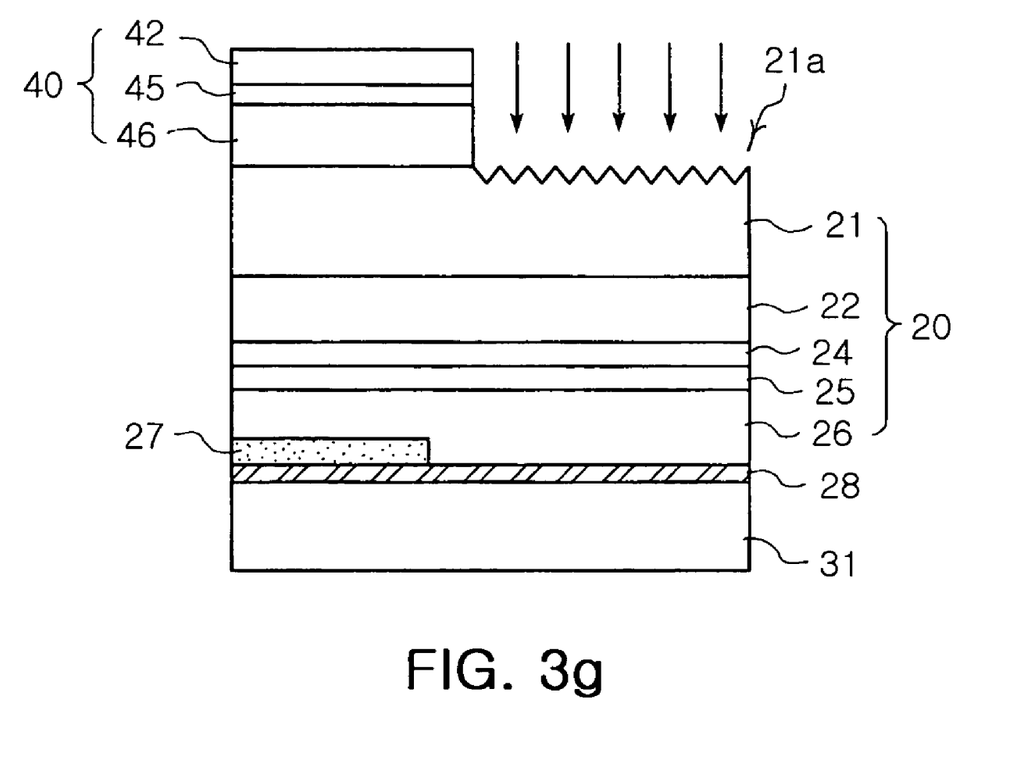

Thereafter, as shown in FIG. 3g, a rough pattern 21a is formed on the exposed area of the conductive substrate 21. The rough pattern 21a is employed to improve light extraction efficiency of the first light emitter 20. In forming the rough pattern 21a, a conventional dry etching process such as ICP may be adopted. Also, additionally, a GaAs substrate 41 of FIG. 3f is removed from the second light emitter 40. The GaAs substrate 41 of FIG. 3f demonstrates low light transmissibility, thereby degrading efficiency of red light emitted from the second light emitter 40. The GaAs substrate can be easily removed via a conventional wet-etching process known in the art.

Figure 3H:
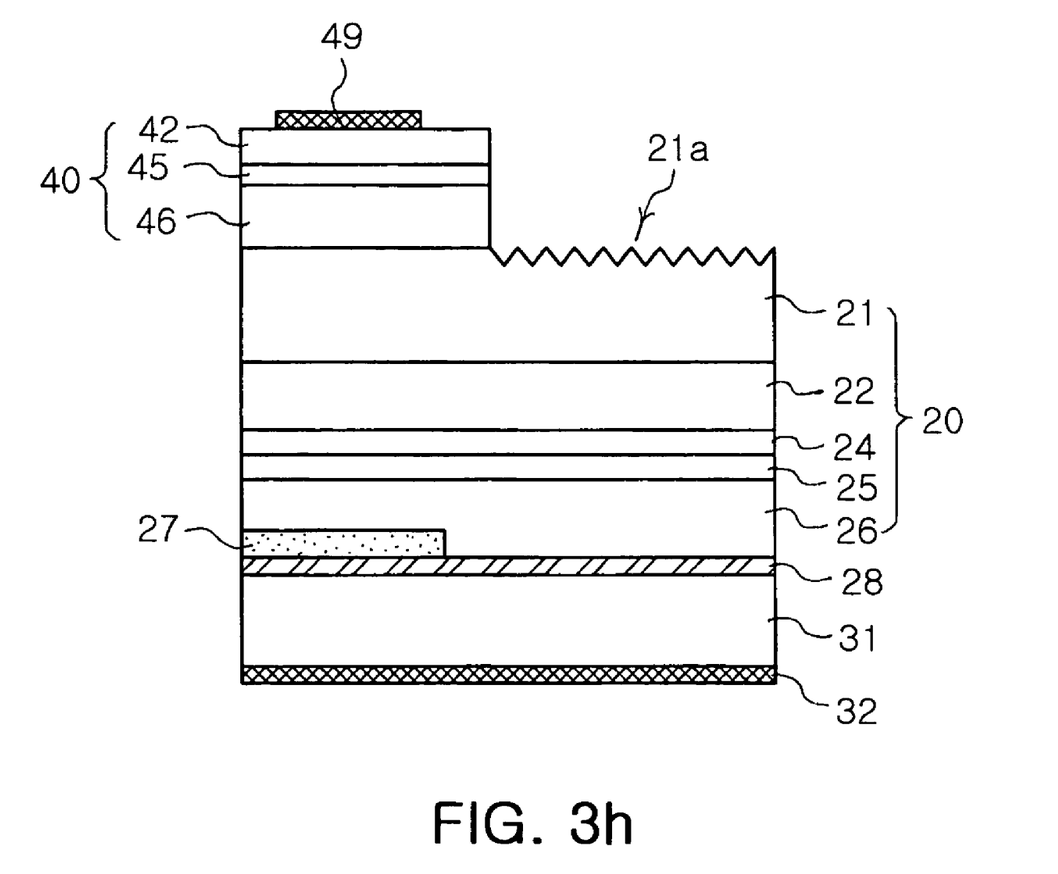

Finally, as depicted in FIG. 3h, a p-electrode 32 is formed on an underside of the conductive submount substrate 31 and an n-electrode 49 is formed on a top surface of the n-type semiconductor layer 42 of the second light emitter 40. The p-electrode 32 and n-electrode 49 are provided as common electrodes of the first light emitter 20 and the second light emitter 40.

In the embodiment just described, the p- and n-electrodes 32 and 49 are used as common electrodes. However, as shown in FIG. 4, each emitter may be driven independently via separate electrodes.

Figure 4:
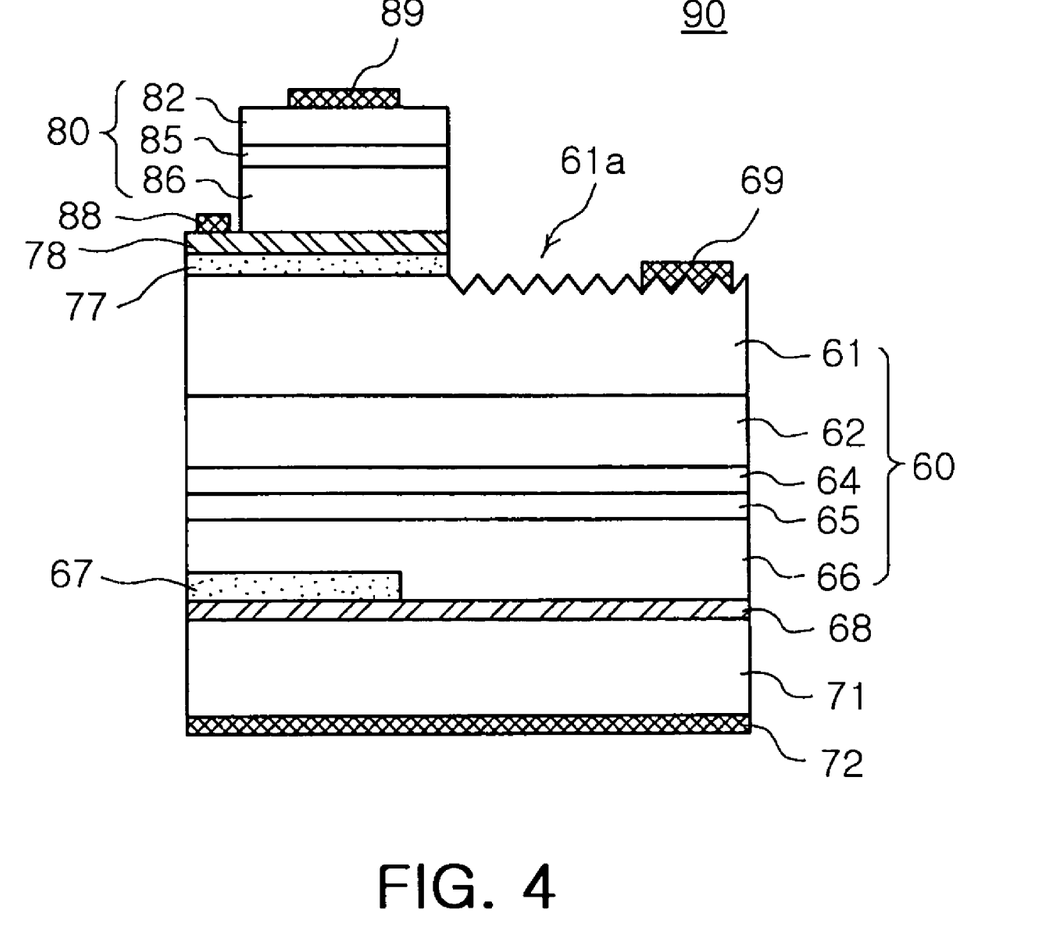
FIG. 4 is a cross-sectional view illustrating a white light emitting device according to another embodiment of the invention.

FIG. 4 is a cross-sectional view illustrating a white light emitting device according to another embodiment of the invention.

The white light emitting device 90 includes a conductive submount substrate 17 and first and second light emitters 60 and 80 for emitting light of different wavelengths. The conductive submount substrate 71 may be a silicon substrate or a metal substrate doped with p-type impurities.

The first light emitter 50 is of a nitride stack structure in which a p-type nitride semiconductor layer 66, two nitride active layers 64 and 65 and an n-type nitride semiconductor layer 62 and a conductive substrate 61 are disposed sequentially from bottom to top. Herein, the conductive substrate 61 may be a conductive GaN substrate. In the first light emitter 60, the p-type nitride semiconductor layer 66 is bonded onto the submount substrate 71 via a first metal layer 68.

The first metal layer 78 is made of a general bonding metal selected from a group consisting of Au—Sn, Sn, In, Au—Ag and Pb—Sn. Preferably, the first metal layer 78 may include a high reflectivity metal. The high reflectivity metal may be selected from a group consisting of Al, Ag, Rh, Ru, Pt, Pd and alloys thereof.

In this embodiment, an insulating layer 77 is additionally formed on a partial area of the conductive substrate 61 where the second light emitter 80 will be formed. The insulating layer 77 electrically separates the first light emitter 60 from the second light emitter 80. To ensure a sufficient light extraction area of the first light emitter 60, preferably, the partial area of the conductive substrate having the insulating layer 77 thereon is smaller than a remaining area of the conductive substrate 71. A second metal layer 78 is formed on the insulation layer 77. The second metal layer 78 is made of a metal similar to that of the first metal layer 68.

The second light emitter 80 is formed on a partial area of the second metal layer 78. The second light emitter 80 includes a p-type AlGaInP-based semiconductor layer 86, an AlGaInP-based active layer 85, and an n-type AlGaInP-based semiconductor layer 82 stacked sequentially from bottom to top. The conductive substrate 61 has a rough pattern 61a formed on an area where the second light emitter 80 is not formed, thereby significantly enhancing light extraction efficiency.

In this structure, the first light emitter 60 and the second light emitter 80 may be driven by separate electrodes. For the first light emitter 60, a first p-electrode 72 is formed on an underside of the conductive submount substrate 61 and an n-electrode 69 is formed on another area of the conductive substrate. Also, for the second light emitter 80, a second p-electrode 88 is formed on the remaining area of the second metal layer 78 and a second n-electrode 89 is formed on the second n-type AlGaInP-based semiconductor layer 82.

The electrodes arranged according to this embodiment allow the first light emitter 60 and the second light emitter 80 to be driven independently. Furthermore, the structure of this embodiment has an advantage over the embodiment of FIG. 2 in that series resistance can be decreased to reduce driving voltage.

In a similar manner to the embodiment of FIG. 2, the white light emitting device 90 can generate white light by combining light of wavelengths of the first light emitter 60 and the second light emitter 80. According to this embodiment, two active layers 64 and 65 of the first light emitter 60 generate light of wavelengths of about 450 nm to 475 nm and about 510 nm to 535 nm, respectively, and an active layer 85 of the second light emitter 80 generates light of wavelength of about 600 to 635 nm.

The invention can be advantageously adopted in case where a non-conductive transparent substrate such as a sapphire substrate is used for the first light emitter. At this time, the first light emitter is flip-chip bonded to the submount substrate.

Figure 5:
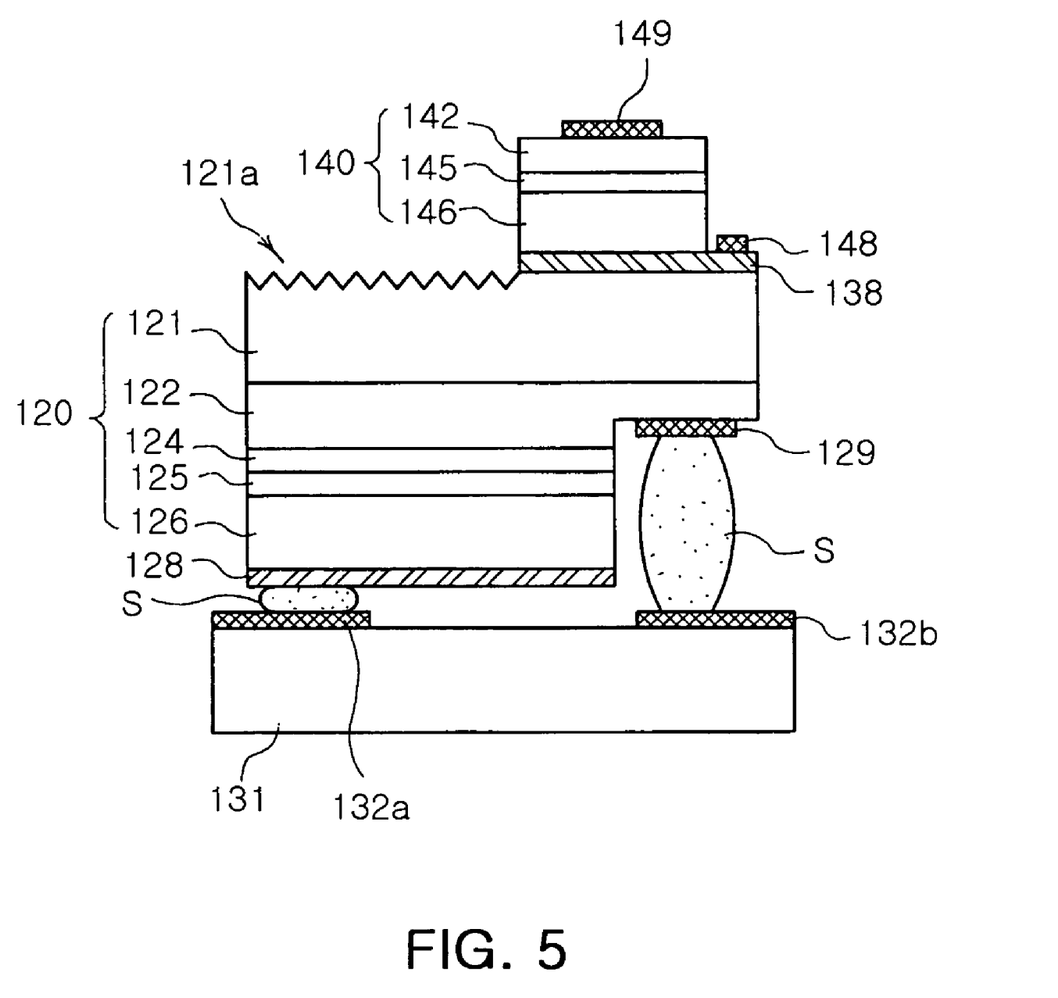
FIG. 5 is a cross-sectional view illustrating a white light emitting device according to further another embodiment of the invention.

FIG. 5 is a cross-sectional view illustrating further another embodiment in which a substrate of the first light emitter is a non-conductive substrate.

The white light emitting device 130 includes a submount substrate 131, and first and second light emitters 120 and 140 for emitting light of different wavelengths. The submount substrate 131 has a p-lead electrode 132a and an n-lead electrode 132b disposed thereon. The substrate 131 includes but not limited to a silicon substrate or a metal substrate. To fabricate the substrate 131, a thermal oxide layer (not illustrated) is formed on a general silicon substrate to deposit the electrically decoupled lead electrodes 132a and 132b.

The first light emitter 120 includes a p-type nitride semiconductor layer 126, two nitride-based active layers 124 and 125, an n-type nitride semiconductor layer 122 and an insulating substrate 121 stacked sequentially from bottom to top. Also, the first light emitter 120 is mesa-etched to partially expose the n-type nitride semiconductor layer 122. In this embodiment, the insulating substrate 121 may be a sapphire substrate. A first metal layer 128 is formed on the p-type nitride semiconductor layer 126. The first metal layer 128 may include a high reflectivity metal. The high reflectivity metal is selected from a group consisting of Al, Ag, Rh, Ru, Pt, Pd and alloys thereof. A separate ohmic contact layer (not illustrated) may be inserted between the first metal layer 128 and p-type nitride semiconductor layer 126. Preferably, a light transmitting oxide layer such as Cu-doped $In_2O_3$ may be used.

The first light emitter 120 is flip-chip bonded to the submount substrate 131. That is, the p-type nitride semiconductor layer 126 and the exposed n-type nitride semiconductor layer 122 are bonded to the p- and n-lead electrodes 132a and 132b by solder bumps S.

In this embodiment, a second metal layer 138 is formed on a partial area of the insulating substrate 121 where the second light emitter 140 will be formed. The substrate 121 of the first light emitter 120 is electrically insulating so that the second metal layer 138 can be directly formed on the substrate 121. To ensure a sufficient light extraction area of the first light emitter 120, the partial area of the insulating substrate 121 having the second metal layer 138 thereon is smaller than a remaining area of the substrate 121.

The second light emitter 140 is formed on a partial area of the second metal layer 138. The second light emitter 140 includes a p-type AlGaInP-based semiconductor layer 146, an AlGaInP-based active layer 145 and an n-type AlGaInP-based semiconductor layer 142 stacked sequentially from bottom to top. The insulating substrate 121 has a rough pattern 121a formed on an area where the second light emitter 140 is not formed. This allows dramatic improvement in light extraction efficiency of the first light emitter 120.

In this structure, the first light emitter 120 and the second light emitter 140 can be driven independently. The first light emitter 120 is driven by respective lead electrodes 132a and 132b disposed on the submount substrate 131. Meanwhile, for the second light emitter 140, a p-electrode 148 is formed on the remaining area of the second metal layer 138 and an n-electrode 149 is formed on the n-type AlGaInP-based semiconductor layer 142. Alternatively, the first and second light emitters 120 and 140 can be driven simultaneously to enable white light emission.

As set forth above, the invention provides a desired monolithic white light emitting device through a relatively simple process by bonding two emitters integrally via wafer bonding and/or metal bonding. The invention provides a white light emitting device with excellent white light efficiency free from fluorescent substance-induced defects since the invention employs emitters emitting light of different wavelengths without using fluorescent substance.

While the present invention has been shown and described in connection with the preferred embodiments, it will be apparent to those skilled in the art that modifications and variations can be made without departing from the spirit and scope of the invention as defined by the appended claims.

What is claimed is:

1. A white light emitting device comprising:
   a conductive submount substrate;
   a first light emitter bonded onto the conductive submount substrate by a metal layer, the first light emitter including a p-type nitride semiconductor layer, a first active layer, an n-type nitride semiconductor layer and a conductive substrate stacked sequentially from bottom to top;
   a second light emitter formed on only a partial area of a top surface of the conductive substrate, the second light emitter including a p-type AlGaInP-based semiconductor layer, a second active layer and an n-type AlGaInP-based semiconductor layer stacked sequentially from bottom to top;
   a p-electrode formed on an underside of the conductive submount substrate; and
   an n-electrode formed on a top surface of the n-type AlGaInP-based semiconductor layer,
   wherein the partial area of the top surface of the conductive substrate is smaller than the remaining area of the top surface of the conductive substrate.

2. The white light emitting device according to claim 1, wherein the conductive substrate is directly bonded to the p-type AlGaInP-based semiconductor layer of the second light emitter by wafer bonding, and
   wherein the p- and n-type electrodes are common electrodes of the first and second light emitters.

3. The white light emitting device according to claim 2, further comprising a current blocking layer formed on the p-type nitride semiconductor layer of the first light emitter, over a surface area of the p-type nitride semiconductor layer vertically overlapped with a second light emitter forming area.

4. The white light emitting device according to claim 3, wherein the current blocking layer is doped with n-type impurities.

5. The white light emitting device according to claim 3, wherein the current blocking layer comprises a silicon oxide film or a silicon nitride film.

6. The white light emitting device according to claim 1, further comprising:
- an insulating layer formed on the partial area of the conductive substrate, the insulating layer being bonded to the p-type AlGaInP-based semiconductor layer of the second light emitter by an additional metal layer; and
- a p-electrode connected to the additional metal layer and an n-electrode connected to the conductive substrate.

7. The white light emitting device according to claim 1, wherein the metal layer comprises a high reflectivity metal selected from a group consisting of Al, Ag, Rh, Ru, platinum Pt, Pd and alloys thereof.

8. The white light emitting device according to claim 6, wherein the metal layer and the additional metal layer comprise a high reflectivity metal selected from a group consisting of Al, Ag, Rh, Ru, platinum Pt, Pd and alloys thereof.

9. The white light emitting device according to claim 1, wherein the conductive submount substrate is a p-type silicon substrate.

10. The white light emitting device according to claim 1, wherein the first active layer is adapted to generate light of a wavelength of about 450 nm to 475 nm and the second active layer is adapted to generate light of a wavelength of about 550 nm to 600 nm.

11. The white light emitting device according to claim 1, wherein the first active layer includes two active layers for generating light of a wavelength of about 450 nm to 475 nm and light of a wavelength of about 510 nm to 535 nm, respectively, and
wherein the second active layer is adapted to generate light of a wavelength of about 600 nm to 635 nm.

12. A white light emitting device comprising:
a conductive submount substrate;
a first light emitter bonded onto the conductive submount substrate by a metal layer, the first light emitter including a p-type nitride semiconductor layer, a first active layer, an n-type nitride semiconductor layer and a conductive substrate stacked sequentially from bottom to top;
a second light emitter formed on only a partial area of a top surface of the conductive substrate, the second light emitter including a p-type AlGaInP-based semiconductor layer, a second active layer and an n-type AlGaInP-based semiconductor layer stacked sequentially from bottom to top;
a p-electrode formed on an underside of the conductive submount substrate; and
an n-electrode formed on a top surface of the n-type AlGaInP-based semiconductor layer,
wherein the conductive substrate has a rough pattern formed on an area where the second light emitter is not formed, and
the partial area of the top surface of the conductive substrate is smaller than the remaining area of the top surface of the conductive substrate.

* * * * *